United States Patent
Morton (10) Patent No.: US 10,454,248 B1
(45) Date of Patent: *Oct. 22, 2019

(54) ULTRA-LOW NOISE, HIGHLY STABLE SINGLE-MODE OPERATION, HIGH POWER, BRAGG GRATING BASED SEMICONDUCTOR LASER

(71) Applicant: Morton Photonics Incorporated, West Friendship, MD (US)

(72) Inventor: Paul A. Morton, West Friendship, MD (US)

(73) Assignee: Morton Photonics Incorporated, West Friendship, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/246,820

(22) Filed: Jan. 14, 2019

Related U.S. Application Data (63) Continuation of application No. 15/683,380, filed on Aug. 22, 2017, now Pat. No. 10,193,306.
(Continued)

(51) Int. Cl.
*H01S 5/14* (2006.01)
*H01S 5/024* (2006.01)
(Continued)

(52) U.S. Cl.
CPC ............. *H01S 5/146* (2013.01); *H01S 5/028* (2013.01); *H01S 5/02415* (2013.01);
(Continued)

(58) Field of Classification Search
CPC ........ H01S 5/146; H01S 5/141; H01S 5/0245; H01S 5/02415; H01S 5/02438;
(Continued)

(56) References Cited

U.S. PATENT DOCUMENTS 6,819,703 B1  11/2004  Omura et al.
10,193,306 B2 *  1/2019  Morton
(Continued)

FOREIGN PATENT DOCUMENTS

WO  2012149068 A1  11/2012

OTHER PUBLICATIONS

C. H. Henry, 'Theory of the Phase Noise and power Spectrum of a Single Mode Injection Laser', IEEE J. Quant. Elec. QE-19, p. 1391 (1983).
(Continued)

*Primary Examiner* — Armando Rodriguez
(74) *Attorney, Agent, or Firm* — Myers Wolin, LLC (57) ABSTRACT

A laser including: a gain chip; an external cavity incorporating a Bragg grating; and a baseplate; wherein a first end of the gain chip has a high reflectivity facet forming a first end of the laser cavity; a second end of the gain chip has a low reflectivity facet; and a second part of the external cavity comprises a Bragg grating, supported by the baseplate, the temperature of the baseplate being maintained through a feedback loop; wherein the optical length of the external cavity is at least an order of magnitude greater than the optical length of the gain chip; wherein the Bragg grating is physically long and occupies a majority of the length of the external cavity and is apodized to control the sidemodes of the grating reflection.

16 Claims, 5 Drawing Sheets

Related U.S. Application Data (60) Provisional application No. 62/377,760, filed on Aug. 22, 2016.

(51) Int. Cl.
*H01S 5/06* (2006.01)
*H01S 5/125* (2006.01)
*H01S 5/10* (2006.01)
*H01S 5/028* (2006.01)
*H01S 5/0687* (2006.01)

(52) U.S. Cl.
CPC ........ *H01S 5/02438* (2013.01); *H01S 5/0612* (2013.01); *H01S 5/0687* (2013.01); *H01S 5/1039* (2013.01); *H01S 5/125* (2013.01); *H01S 5/141* (2013.01)

(58) Field of Classification Search
CPC .... H01S 5/02476; H01S 5/028; H01S 5/0612; H01S 5/0687; H01S 5/1039; H01S 5/1225; H01S 5/125; H01S 5/163
See application file for complete search history.

(56) References Cited

U.S. PATENT DOCUMENTS

2004/0131102 A1  7/2004 Jette et al.
2006/0198404 A1  9/2006 Henrichs

OTHER PUBLICATIONS

C. H. Henry, 'Phase Noise in Semiconductor Lasers', IEEE J. Lightwave Tech., LT-4, p. 298 (1986).

R. F. Kazarinov, C. H. Henry, 'The Relation of Line Narrowing and Chirp Reduction Resulting from the Coupling of a Semiconductor Laser to a Passive Resonator', IEEE J. Quant. Elec. QE-23, p. 1391 (1983).

K. Vahala, A. Yariv, 'Detuned loading in coupled cavity semiconductor lasers—Effect on quantum noise and dynamics', Appl. Phys. Lett., 45, p. 501 (1984).

A. Yariv, R. Nabiev, K. Vahala, 'Self-quenching of fundamental phase and amplitude noise in semiconductor lasers with dispersive loss', Optics Letters, 15, p. 1359 (1990).

USPTO Non-Final Office action dated Feb. 22, 2018, for corresponding U.S. Appl. No. 15/683,380.

International Search Report issued for corresponding International Patent Application No. PCT/US2017/048004, dated Dec. 28, 2017.

Stephen G. Lynch et al., "External cavity diode laser based upon an FBG in an integrated optical fiber platform," Optics Express, pp. 8391-8398, vol. 24, paragraphs 1-3, fig. 1-3, 5, Apr. 18, 2016.

USPTO Notice of Allowance dated Jul. 19, 2018, for corresponding U.S. Appl. No. 15/683,380.

USPTO Notice of Allowance dated Sep. 19, 2018, for corresponding U.S. Appl. No. 15/683,380.

* cited by examiner

ULTRA-LOW NOISE, HIGHLY STABLE SINGLE-MODE OPERATION, HIGH POWER, BRAGG GRATING BASED SEMICONDUCTOR LASER

CROSS REFERENCE TO RELATED APPLICATIONS

This application is a continuation of U.S. Non-Provisional application Ser. No. 15/683,380 filed on Aug. 22, 2017, which claims the benefit of U.S. Provisional Patent Application No. 62/377,760 filed on Aug. 22, 2016. The disclosures of U.S. Non-Provisional application Ser. No. 15/683,380 and U.S. Provisional Patent Application 62/377,760 are hereby incorporated by reference.

FIELD OF THE INVENTION

This invention relates generally to semiconductor lasers, and more particularly to ultra-low noise, narrow-linewidth, highly stable single-longitudinal-mode operation, high power, Bragg grating based semiconductor lasers.

BACKGROUND

Lasers with an ultra-low noise, including narrow linewidth operation, e.g. ~1 kHz down to 1 Hz linewidth, are often required to support high performance optical communication systems and sensing systems, as well as low relative intensity noise (RIN) operations, e.g. <−155 dB/Hz. High power is also required for use in high performance systems without the need for optical amplification, or for limited booster amplification, with power levels from e.g. 50 mW up to 200 mW being required. Operating wavelengths can include a very wide range, ranging from ultraviolet (UV) e.g. 250 nm out to many microns, e.g. >10 microns.

Existing low-noise, narrow linewidth lasers such as solid-state lasers and fiber lasers have large size, large cost, limited operating wavelength ranges, and they are often unreliable and not suited for wide-scale commercial deployment. Semiconductor lasers have proven to be the best solution for wide-scale commercial deployment because they leverage the benefits of the semiconductor manufacturing process. Existing semiconductor-based laser systems cannot adequately support high performance systems with all the above requirements. Therefore, there is a need for an ultra-low noise, highly stable singlemode operation, and high power semiconductor-based laser to meet this long-felt need.

The following novel concepts according to embodiments of the present invention provide an ultra-low noise, highly stable singlemode operation, high power, semiconductor-based external cavity laser (ECL). Singlemode operation specifically refers to single-longitudinal mode or single-frequency operation consistent with a narrow linewidth laser. The concepts are applicable to both a hybrid integrated version using a Bragg grating based reflector and separate gain chip, or an integrated laser (monolithic or heterogeneously integrated).

SUMMARY

To create an ultra-low phase (or frequency) noise laser, characterized by a very narrow linewidth as well as very small low-frequency phase (frequency) noise, the laser cavity should have a very long photon lifetime; that is, a long cavity and a high storage of photons compared to the number of photons leaving the cavity. Therefore, the first concept used in the basic design of this ultra-low noise laser according to an embodiment is to use a long external cavity to reduce the noise, linewidth, etc. The effects of using a long external cavity in laser are described in Refs. [1]-[3].

Using a broadband reflector with a long external cavity produces a narrow linewidth laser, however, the laser is not stable and is unlikely to operate in a single mode, and will generally mode-hop (jump) between different possible laser cavity modes with only small gain differences; this is the approach taken by many other researchers. In order to provide singlemode operation, a grating, such as a fiber Bragg grating (FBG), can be used to provide the feedback; the FBG provides a narrow reflection bandwidth, and provides mode control so that singlemode operation can be achieved.

Semiconductor lasers have their linewidth increased due to the alpha factor, $\alpha$, also known as the linewidth enhancement factor, which increases the Schawlow Townes linewidth by a factor $(1+\alpha^2)$, and so a low alpha factor will reduce the linewidth of such a laser (see Refs. [1] and [2]).

An important concept for reducing the laser linewidth is operation on the high-slope, long wavelength side of a grating reflector. This takes advantage of an effect described in Refs. [3]-[5], often called "Detuned Loading", as described in those references; the use of a frequency dependent loss mechanism (e.g. a dispersive loss), together with the alpha-factor of the laser (the linewidth enhancement factor), to simultaneously increase the modulation bandwidth of the laser while reducing the chirp and noise. The long wavelength slope of the grating has the correct sign to work with the alpha-factor to reduce noise and make the laser stable. The opposite happens on the short wavelength side of the grating. An increased value of the frequency dependent loss (higher slope) has a strong effect in reducing noise, leading to designs with long gratings that have very high slope and very narrow bandwidth. In the design of hybrid-integrated laser according to an embodiment, all the design requirements are achieved at the same time; long cavity, detuned loading, and excellent mode selectivity, through very careful grating and laser cavity design. By designing the laser to operate with an extended singlemode operating range, the lasing mode can be set to be on the long wavelength slope of the grating, by controlling the cavity phase; the larger the singlemode range, the further to the long wavelength side the laser will operate, providing a lower linewidth output.

Using the design concepts described in the above embodiments, a laser cavity design including a high power gain chip (i.e. longer gain chip, such as 1-3 mm long) and an FBG external cavity can be achieved, with a high coupling efficiency fiber lens placed close to the FBG to couple light from the gain chip to the FBG efficiently.

One embodiment of the present invention provides a laser including: a semiconductor gain chip; an external cavity; and a first thermally conductive baseplate; wherein a first end of the gain chip has a high reflectivity facet forming a first end of the laser cavity; a second end of the gain chip has an low reflectivity facet, allowing light generated from the gain chip to be coupled with a first end of the external cavity; and a second part of the external cavity includes a Bragg grating which forms the second end of the laser cavity, supported by the first thermally conductive baseplate, the temperature of the Bragg grating being maintained through a feedback loop comprising a first thermo-electric cooler (TEC) and a first thermistor attached to the first thermally conductive baseplate; wherein the optical length of the external cavity is at least an order of magnitude greater than the optical length of the gain chip; wherein the Bragg grating occupies a majority of the length of the external cavity; and wherein the Bragg grating is apodized to control the side-modes of the grating reflection.

DETAILED DESCRIPTION OF THE PREFERRED EMBODIMENTS

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

Figure 1:
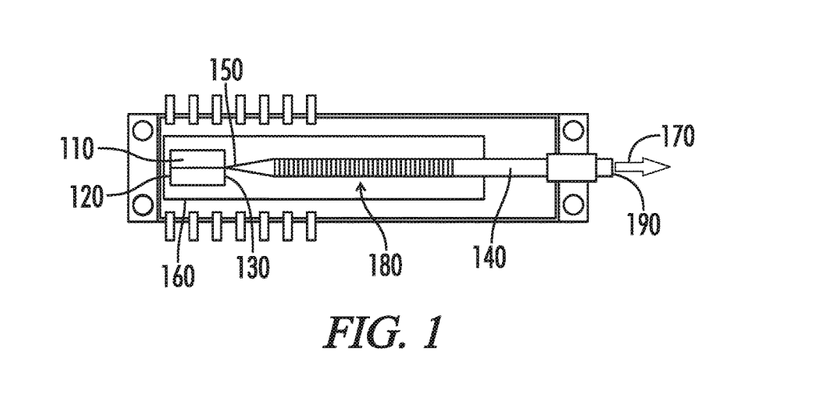
FIG. 1 is schematic diagram of an ultra-low noise laser design according to an embodiment of the present invention.

FIG. 1 is a schematic of an ECL incorporating a gain chip and external fiber cavity with a fiber Bragg grating (FBG) in the fiber cavity. A TEC under the baseplate on which the gain chip and FBG are placed controls the temperature. As shown in FIG. 1, an external cavity laser according to an embodiment of the present invention includes a semiconductor gain element, or gain chip 110, coupled to an external cavity 140, including an FBG 180 which provides the other end of the laser cavity. The laser radiation 170 is output through the fiber which incorporates the FBG. The gain chip 110 has a high reflectivity (HR) facet 120 forming one end of the laser cavity, and low reflectivity facet 130 to avoid reflections and allow the light within the gain chip to be coupled into an external cavity. The low reflectivity facet can be implemented using an anti-reflection (AR) coating or angled waveguide facet or a combination of AR coating and angled waveguide facet. Light is coupled into the external cavity, which can be in an optical fiber, as shown in FIG. 1, or may be in a waveguide (e.g. silica, silicon or silicon nitride waveguide), and the end of the fiber can be lensed and AR coated 150, or a lens placed between the fiber/waveguide and gain chip, or the gain chip modified to provide high coupling efficiency directly to the external cavity. High coupling efficiency between the gain chip and external cavity is required to create a high power laser, requiring some lensing scheme or a gain chip with a beam expander to obtain coupling efficiencies to the external cavity of at least 60%. The baseplate or heatsink 160 under the gain chip and FBG is temperature controlled by a thermo-electric cooler (TEC), using temperature feedback from a temperature sensor, e.g. a thermistor placed close to the gain chip. Those skilled in the art understand that 'thermistor' represents many possible devices that can be used to monitor temperature for the purpose of controlling temperature, such as a bi-metal thermal couple, semiconductor diode junction, or negative temperature dependence (NTD) device.

The Bragg grating 180 can be written directly into an optical fiber, as in a fiber Bragg grating (FBG), which can be accomplished with tremendous precision using industrial processes to create FBGs with extremely well controlled reflection properties, such as extremely narrow reflection bandwidth, grating apodization (to control sidelobes), and controlled grating chirp. The FBG is a preferred approach to develop ultra-low noise ECLs, due to the extreme control that can be used in fabricating these devices, leading to an extremely narrow reflection bandwidth with very sharp filter characteristics. Similar gratings are possible in silicon nitride based waveguides, silica and other low loss waveguides, using ultra-low kappa grating designs, which can also be used in these ultra-low noise lasers.

In order to provide a very stable singlemode operation device with ultra-low linewidth, a long grating or FBG is used in the laser cavity, providing a long cavity length, also providing a very narrow reflection bandwidth. When taken to the extreme, as in this concept, the FBG itself makes up a large portion of the laser cavity, at least 75%, providing excellent mode control and ensuring that only one mode can lase. The bandwidth of the FBG narrows as it is extended in length, countering the effect of the narrower mode spacing from the long laser cavity, while the proportion of the laser cavity within the FBG increases. The concept is to make the grating a sufficiently large part of the overall cavity length to ensure singlemode operation for a large part of the operating range of the laser, e.g. for high power gain chip physical lengths in the range of 600 microns to 1 mm or more (equivalent to optical length ~2 mm to 3.5 mm in air), the FBG physical length should be significantly longer, e.g. ≥40 mm (equivalent to optical length ≥60 mm in air), i.e. in this case the FBG is ~20× the optical length of the gain chip, to ensure a large singlemode operating range. The grating must start close to the gain chip, i.e. there should be no long region of the external cavity without a grating in it. As the grating is made longer, e.g. 50 mm or 100 mm, the percentage of the overall cavity being part of the grating increases, making the laser singlemode operation range even larger. Alternatively, the longer grating can support a longer gain chip (for higher power) or longer gain chip plus laser cavity region without a grating. Increasing the percentage of the laser cavity taken up by the grating, and fabricating a grating with as narrow a bandwidth as possible, creates the condition where for much of the operating range of the laser, i.e. for different cavity phases, the device has only one possible lasing mode and a very stable singlemode operation, providing a large singlemode operating range.

The optimum design for providing a wide singlemode operating region has the fiber lens at the edge of the FBG, or close to it. This can be accomplished practically by lensing the FBG fiber very close to the end of the FBG. The lensed fiber end provides the high coupling efficiency required for high power laser operation. The fiber lens is also AR coated to reduce unwanted optical reflections within the laser cavity, which can increase laser noise and reduce the singlemode operation range if significant.

A major issue with using a long grating or FBG in the laser cavity as described above is that the reflection characteristics of the long FBG (or integrated Bragg grating) become more sensitive to variations in the local grating sections along the length of the Bragg grating, especially as the FBG length is increased sufficiently to provide a very narrow bandwidth and also provide a large singlemode operating region. The longer the FBG, the narrower its bandwidth, and therefore the more sensitive it is to local variations which may occur from changes in temperature or strain along the length of the FBG. Variations in temperature along the length of a long FBG are inevitable when one end of the FBG is mechanically and thermally attached close to the gain chip, which itself is a heat source that increases in heat generation as its current bias is increased. For the long FBG lengths envisioned in this novel laser design, e.g. ≥40 mm in length, small variations in temperature, e.g. tenths of a degree, change the reflection peak wavelength along the length of the FBG and therefore broaden its bandwidth; which reduces the singlemode operating range of the laser. For this reason, lasers incorporating a Bragg reflector designed by other researchers have limited the length of the Bragg reflector. The following novel concepts according to embodiments of the present invention are proposed in order to overcome this limitation, and allow clean singlemode operation over a wide range for much longer FBG lengths, leading to lasers with narrower linewidth.

Figure 2:
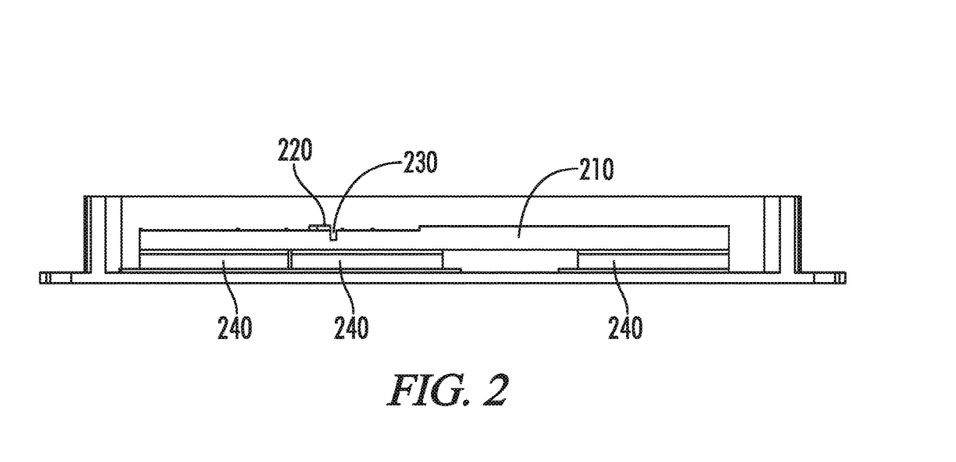
FIG. 2 shows a side view of an ultra-low noise laser design according to an embodiment of the present invention.

The first concept according to an embodiment of the present invention incorporates the FBG and gain chip on the same long thermally conductive baseplate, as shown in FIG. 2. The gain chip on submount 220 is attached to the baseplate 210 next to a narrow trench 230 in the baseplate 210, with the FBG being within a long groove on the right side of the baseplate. One or multiple TECs 240 may be used to control the temperature of the baseplate. The fiber lens is attached close to the trench on the right side. In this concept, at the chosen bias point of the gain chip, there will be a temperature variation along the length of the baseplate related to the heat generated in the gain chip and the conductivity and geometry of the baseplate. The temperature profile along the FBG (provided by the gain chip heating) in one embodiment is optimized through the baseplate geometry (including the trench), so that the temperature reduces linearly versus distance to the right of the trench. The linear temperature variation of the FBG can then be counteracted by a linear wavelength chirp in the FBG, so that the overall effect is an unchirped FBG. More generally, the temperature profile expected along the length of the FBG can be calculated (and measured), and then the FBG can be designed to include a variation in grating pitch along its length (wavelength chirp) that counteracts the temperature profile created by the gain chip. Additionally, more detailed calculations can be made for the temperature variation along the FBG, and the FBG can be written with a more complex wavelength (and/or amplitude) variation along its length, so that at the operating point of the laser (known gain chip bias and temperature profile) the FBG exhibits the designed reflection response, which can be more complex in order to improve the laser performance (amplitude and/or phase/wavelength variations).

Figure 3:
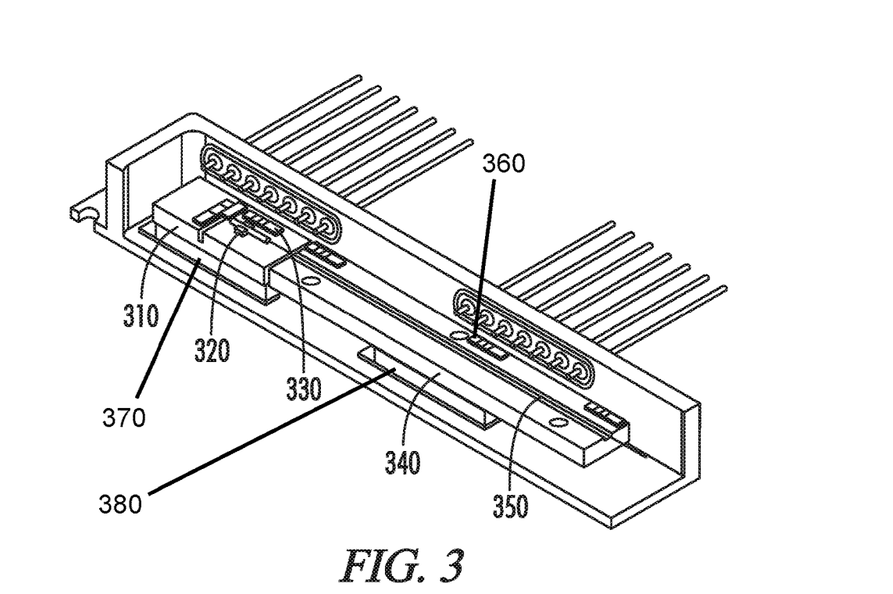
FIG. 3 shows an ultra-low noise laser design according to another embodiment of the present invention.
Figure 8:
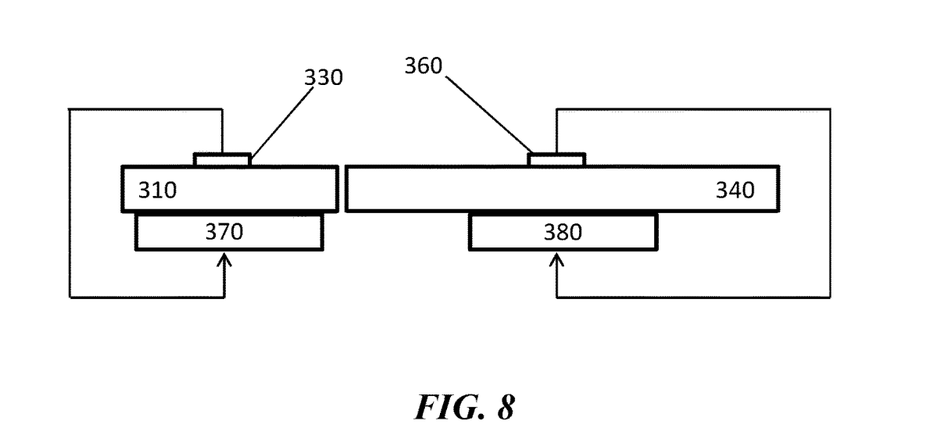
FIG. 8 shows a temperature control using feedback loops according to an embodiment of the present invention.

The second design concept according to an embodiment of the present invention places the gain chip and FBG on separate baseplates (or heatsinks) 310, 340, as shown in FIG. 3, so that the gain chip baseplate 310 can be kept at one temperature (through the use of a TEC 370 and thermistor 330 within a feedback loop) while the FBG baseplate 340 temperature is controlled separately (with a second TEC 380 and thermistor 360). FIG. 8 shows the feedback loops. FIG. 3 shows the fiber and fiber attachment within the package. If a high conductivity FBG holder is placed around the FBG, then the temperature along the FBG within this holder 350 can be kept constant, i.e. very small temperature variation, which supports long FBGs with very narrow bandwidths. To obtain high coupling efficiency from the fiber lens to the gain chip, the fiber lens must be held close to the gain chip, e.g. by a welded clip 320 if laser welding is used for packaging the device, on the same baseplate 310 as the gain chip for stability of this alignment. This leads to the temperature of the end of the FBG next to the fiber lens varying with the temperature of the gain chip. In a standard laser package a thermistor is placed next to the gain chip with a feedback loop used to keep this measured temperature constant, e.g. at 25° C. In one embodiment of the present invention, the thermistor 330 is placed next to the welding clip 320, or fiber holding structure, that holds the lensed end of the FBG, with the feedback loop used to keep this temperature constant (rather than that of the gain chip). With this end of the FBG held at a constant temperature, the rest of the FBG (on its separate baseplate 340) is also set to the same temperature, in this case the entire length of the FBG is held at the same constant temperature. Using this two baseplate approach, with the temperature at the lensed FBG end being fixed on one baseplate kept at the same temperature as the long FBG enclosed in the FBG holder, the entire length of the FBG is held at the same temperature, while also the FBG makes up almost all of the cavity other than the gain chip itself, leading to a large singlemode operating range and a very narrow linewidth laser. This approach can support very long FBG lengths, e.g. up to 100 mm and longer.

Figure 4:
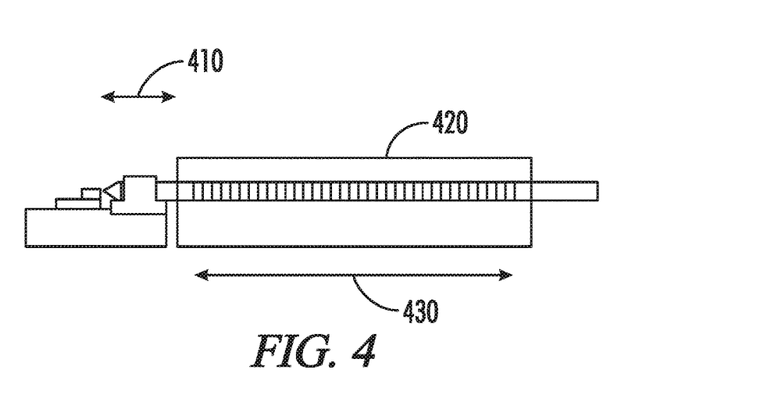
FIG. 4 shows an ultra-low noise laser design according to another embodiment of the present invention.

Using the two separate baseplates as described above, and extending the length of the FBG ≥240 mm, the laser can be provided a good singlemode operating range even as a short section of the fiber cavity between the fiber lens and the start of the grating is made up of fiber without a grating. This short section of fiber without a grating can be extended until the laser singlemode range becomes too limited; the longer the FBG, the longer the non-grating fiber section can be made. By increasing the FBG length, the non-grating fiber length 410 can be extended until it covers the distance from the attached fiber lens end, across to the second baseplate, and into the FBG holder 420 as shown in FIG. 4. This can be accomplished with a mechanical/thermal design that places the holding structure for the FBG lensed end as close as possible to the controlled temperature region of the FBG holder on the second baseplate. When the FBG 430 is entirely enclosed within the FBG holder 420, which is temperature controlled and has a high thermal conductivity, e.g. made of Copper-Tungsten or Aluminum Nitride, the temperature of the FBG can be tuned and the complete FBG will be kept at the same temperature. This provides a way to tune the wavelength of the laser, while keeping the excellent narrow linewidth properties of this laser. This approach works better as the length of the FBG is increased (keeping the non-grating section of the fiber a fixed length), so that longer FBG devices with narrower inherent linewidth can more easily be made tunable in operating wavelength. The temperature of the FBG can be tuned over a very wide temperature range, e.g. 0° C. to 80° C., to provide tunability of the laser wavelength; the wavelength tunability being set by the change in index versus temperature of the FBG. Conversely, using a similar design with the FBG entirely enclosed within a highly thermally conductive holder, keeping the temperature constant along its length, the FBG temperature can be left to float with the temperature of the laser package, i.e. with no TEC or control loop, the device providing the required excellent performance characteristics with the wavelength changing to follow the temperature of the FBG. In this embodiment, no TEC or thermal control loop is required for the FBG, reducing both the cost of the approach and also the power dissipation of the module, with the FBG being operated 'uncooled'.

Figure 5:
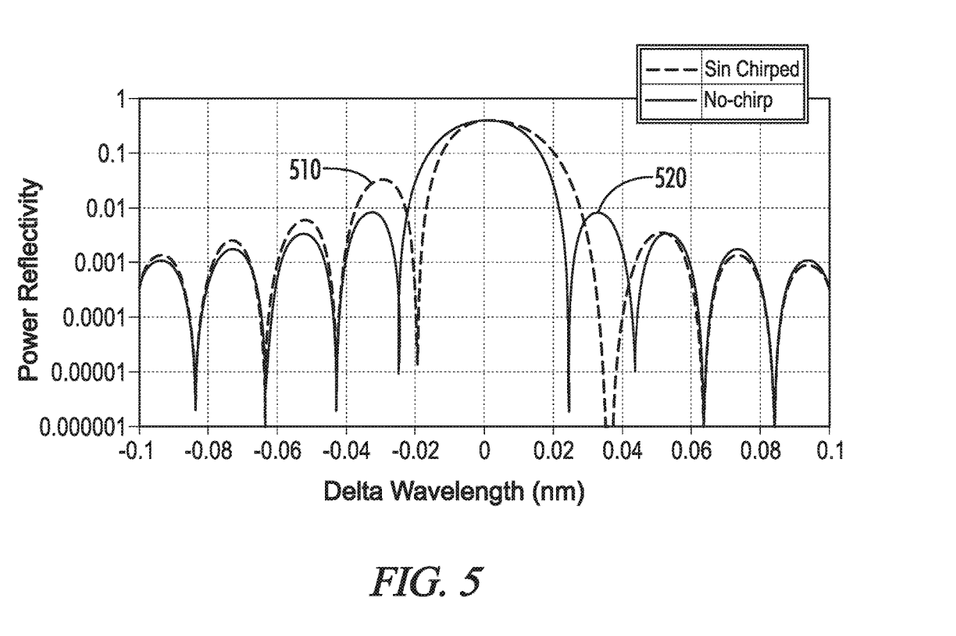
FIG. 5 shows a power reflection spectrum of a 40 mm fiber Bragg grating (FBG) with Gaussian amplitude apodization, and a power reflection spectrum of a Gaussian amplitude apodized 40 mm FBG with added sinusoidal chirp according to an embodiment of the present invention.

In order to extend the singlemode operating range of the laser, the effect of sidemodes of the FBG grating need to be considered. The reflection spectrum of a uniform 40 mm FBG provides the narrowest bandwidth for this grating length, however, the sidemodes are large and affect the singlemode operation range of the laser, as well as its noise performance. The closest sidemode on the long wavelength side of the grating is close to the lasing wavelength, especially when the lasing mode is positioned on the long wavelength side of the grating reflection spectrum in order to reduce the laser linewidth. To extend the singlemode operating range of the laser, the sidemodes of the grating reflection must be reduced. One way to accomplish this is to apodize the grating, i.e. to vary the amplitude along the grating with e.g. a Gaussian profile. The power reflectivity spectrum 520 of a 40 mm FBG that is apodized using a Gaussian amplitude profile is shown in FIG. 5. The grating can also be apodized in its phase, or wavelength, to provide a chirp of the wavelength along the grating, as was used in an embodiment discussed above to counteract the temperature variation along the grating. A concept according to an embodiment of the present invention is to modify the shape of the FBG apodization to eliminate, or reduce the size of, the first sidemode on the long wavelength side of the grating reflection. This is achieved by applying a sinusoidal chirp to the grating, the effect of which is to eliminate/reduce the first long wavelength sidemode, while at the same time the short wavelength sidemode is increased in size. The reflection spectrum 510 for this design, a 40 mm FBG with Gaussian amplitude profile plus the added sinusoidal chirp is also shown in FIG. 5. The elimination/reduction of the first long wavelength sidemode allows the lasing mode to more easily move to longer wavelength without interaction with this close-in mode, and also reduces the relative intensity noise (RIN) that occurs as an interaction between the lasing mode and this first long wavelength sidemode.

In order to control the position of the lasing mode relative to the FBG reflection spectrum, placing it at the optimum position for singlemode stability and optimum noise performance (narrow linewidth and low RIN), i.e. on the long wavelength side of the reflection peak, it would be useful to have a feedback control loop to measure some aspects of the laser operation and use that information to control the mode position. This feedback loop would provide continuous singlemode laser operation over the life of the laser. An alternative approach is to set the laser at the correct operating mode position at the start of its operating life, with the laser design and component reliability optimized to prevent significant movement of the lasing mode from the correct position on the FBG spectrum over the life of the component.

Figure 6:
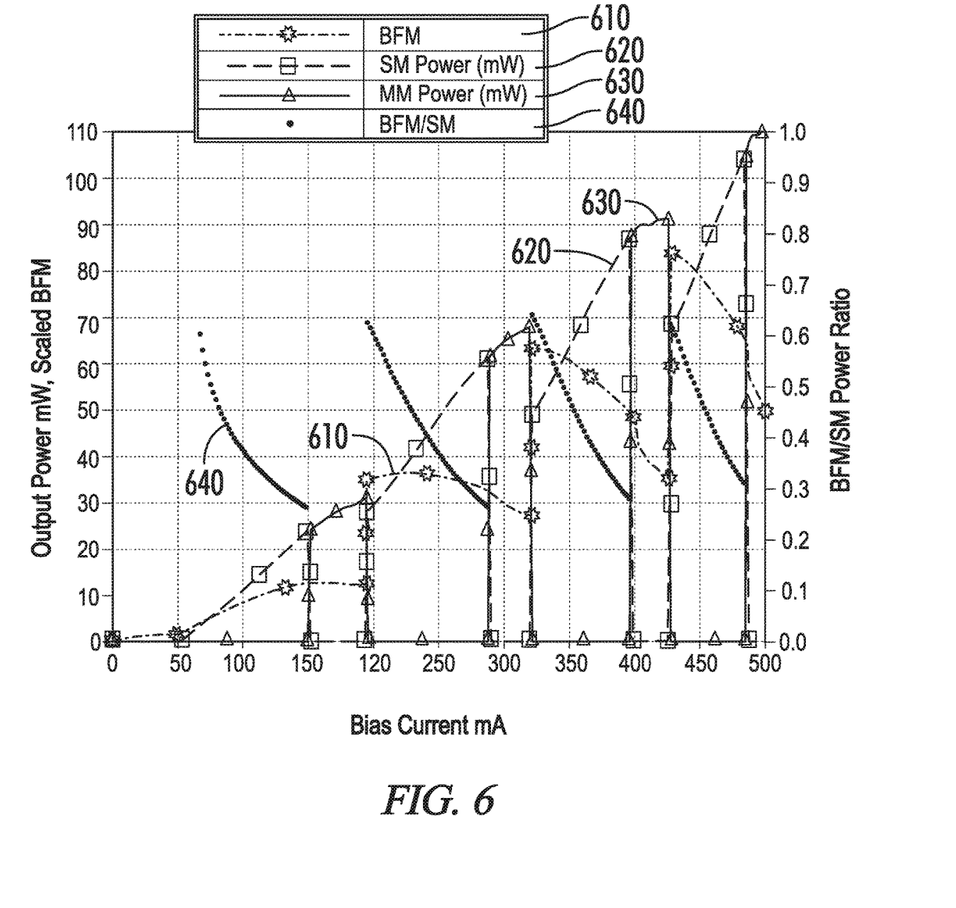
FIG. 6 shows measured characteristics of an ultra-low noise laser according to an embodiment of the present invention.
Figure 7:
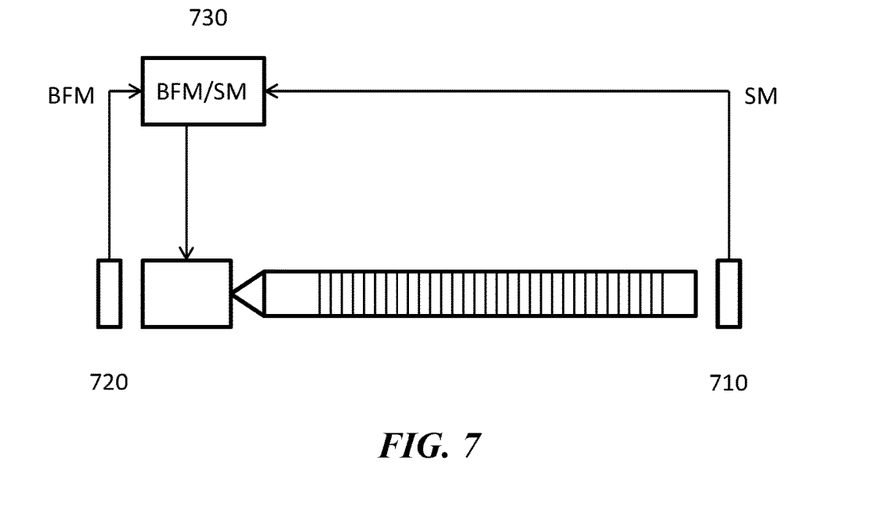
FIG. 7 shows a laser locking using a fast feedback loop according to an embodiment of the present invention.

The very narrow optical filter of the FBG and the novel laser cavity design ensure that only one mode can lase, and if that mode is locked to a specific position on the FBG reflection spectrum, through an electronic feedback loop, then the laser will always stay in that same single mode over the life of the component. The feedback mechanism according to an embodiment of the present invention uses the optical output power of the laser, which has passed through the FBG (a narrow filter), as well as the back facet monitor (BFM) current that measures the light from the gain chip HR facet (no filter) at the other end of the laser. FIG. 7 shows a monitor 710 to measure output power of the laser, and a monitor 720 to measure a BFM current, and a ratio of the BFM value to the output power is used provide a feedback signal 730. Taking the ratio of the BFM value to the output power provides a signal on which to lock the laser; a fixed value for this ratio will set the laser at a specific position on the FBG spectrum. Comparing the BFM and output power signals allows the elimination of laser intensity variations from the feedback signal, as intensity variations are in both signals. An example of the measured singlemode power (SM) 620, the multimode power (MM) 630, the BFM output 610 and the ratio of BFM/SM 640 are shown in FIG. 6 as the current is varied to the gain chip in one of the ultra-low noise lasers according to an embodiment of the present invention. The SM and MM 620, 630 curves show the light versus current characteristics for the external cavity laser, the increased heat in the gain chip as the current is increased changing the cavity phase and moving the laser through a singlemode operating region to a multimode region and then to another singlemode operating region as the phase continues to change. The value of BFM/SM 640 in FIG. 6 clearly shows that this ratio is replicated for each singlemode regime of the laser, and that by choosing the appropriate ratio for BFM/SM the laser can be locked to a specific part of the FBG spectrum, such as choosing a position on the long wavelength side of the FBG spectrum, e.g. a BFM/SM ratio of 0.4.

Locking the laser to a specific value of BFM/SM using a fast feedback loop, which uses the large slope of the FBG filter on the long wavelength side of the FBG spectrum as a frequency discriminator to convert laser output frequency changes to amplitude changes, will also reduce the frequency noise of the laser at frequencies within the feedback loop bandwidth. Reducing the low frequency phase/frequency noise of the laser is important for a number of sensing applications, and in coherent mixing applications.

Note that in FIG. 1, the laser output 170 is shown to be taken from an output surface 190 of the external cavity according to an embodiment. In another embodiment of the laser shown in FIG. 1, the output power can be taken from the first end/high reflectivity facet 120 of the gain chip 110, rather than the fiber 140 which incorporates the FBG 180.

REFERENCES

Ref. [1]: C. H. Henry, 'Theory of the Phase Noise and power Spectrum of a Single Mode Injection Laser', IEEE J. Quant. Elec. QE-19, p 1391 (1983).
Ref. [2]: C. H. Henry, 'Phase Noise in Semiconductor Lasers', IEEE J. Lightwave Tech., LT-4, p 298 (1986).
Ref. [3]: R. F. Kazarinov, C. H. Henry, 'The Relation of Line Narrowing and Chirp Reduction Resulting from the Coupling of a Semiconductor Laser to a Passive Resonator', IEEE J. Quant. Elec. QE-23, p 1391 (1983).
Ref. [4]: K. Vahala, A. Yariv, 'Detuned loading in coupled cavity semiconductor lasers—Effect on quantum noise and dynamics', Appl. Phys. Lett., 45, p 501 (1984).
Ref. [5]: A. Yariv, R. Nabiev, K. Vahala, 'Self-quenching of fundamental phase and amplitude noise in semiconductor lasers with dispersive loss', Optics Letters, 15, p 1359 (1990).

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A laser comprising:
a semiconductor gain chip; and
an external cavity;
wherein a first end of the gain chip has a high reflectivity facet forming a first end of a laser cavity; a second end of the gain chip has a low reflectivity facet, allowing light generated from the gain chip to be coupled with a first end of the external cavity; and a second part of the external cavity comprises a fiber Bragg grating forming a second end of the laser cavity;
wherein the physical length of the fiber Bragg grating is greater than 20 mm and occupies at least 75% of the physical length of the external cavity.

2. The laser of claim 1, wherein the optical length of the external cavity is at least an order of magnitude greater than the optical length of the gain chip.

3. The laser of claim 1, wherein the optical length of the external cavity is at least about twenty times the optical length of the gain chip.

4. The laser of claim 1, wherein the physical length of the gain chip is in the range of about 500 µm to 3 mm, and the physical length of the external cavity is more than about 40 mm.

5. The laser of claim 1, wherein the fiber Bragg grating is apodized to control the sidemodes of the grating reflection.

6. The laser of claim 3, wherein an end of the optical fiber that couples to the gain chip is lensed and anti-reflection coated to increase a coupling efficiency between the gain chip and the external cavity.

7. The laser of claim 1, wherein a lens is placed between the gain chip and the external cavity to increase a coupling efficiency between the gain chip and the external cavity.

8. The laser of claim 1, wherein the gain chip is modified to include a beam expander to increase a coupling efficiency between the gain chip and the external cavity.

9. The laser of claim 1, wherein the gain chip is attached to a first thermally conductive baseplate next to a first side of a trench in the baseplate while the fiber Bragg grating lies within a groove on a second side of the trench;
wherein the temperature of the first thermally conductive baseplate being maintained through a feedback loop comprising a first thermo-electric cooler (TEC) and a first temperature sensor attached to the first thermally conductive baseplate;
wherein heat generated by the gain chip creates a temperature variation along the length of the first thermally conductive baseplate; and
wherein the fiber Bragg grating includes a variation in grating pitch, amplitude, or phase along its length to counteract the temperature variation created by the gain chip, such that a reflection response from the Bragg grating is maintained.

10. The laser of claim 1, wherein the external cavity comprising the fiber Bragg grating is supported by a first thermally conductive baseplate, wherein the temperature of the first thermally conductive baseplate is being maintained through a feedback loop comprising a first thermo-electric cooler (TEC) and a first temperature sensor attached to the first thermally conductive baseplate; and
at least a second thermally conductive baseplate on which the gain chip is mounted, wherein a lensed end of the fiber is mounted on the second baseplate adjacent to the second end of the gain chip; and
at least a second temperature sensor placed next to the lensed end of the fiber;
wherein the second temperature sensor provides feedback to a second TEC attached to the second thermally conductive baseplate, such that both the lensed end of the fiber and the rest of the fiber are kept at the same temperature.

11. The laser of claim 10, wherein the first baseplate and the second baseplate are set to different temperatures.

12. The laser of claim 10, wherein the fiber comprises a non-grating section extending from a location within the first thermally conductive baseplate to the lensed end of the fiber.

13. The laser of claim 12, wherein the first baseplate and the second baseplate are set to different temperatures.

14. The laser of claim 10, wherein the wavelength of the laser is tuned by adjusting the temperature of the Bragg grating within the first thermally conductive baseplate.

15. The laser of claim 11, wherein a temperature of the first thermally conductive baseplate is not actively controlled, rather is left to vary with a temperature of an external package containing the laser.

16. The laser of claim 1, wherein the external cavity comprising the fiber Bragg grating is supported by a first thermally conductive baseplate, wherein the temperature of the first thermally conductive baseplate is being maintained through a feedback loop comprising a first thermo-electric cooler (TEC) and a first temperature sensor attached to the first thermally conductive baseplate, further comprising:

at least a second thermally conductive baseplate on which the gain chip is mounted, wherein a lensed end of the fiber is mounted on the second baseplate adjacent to the second end of the gain chip; and at least a second temperature sensor placed on the second baseplate;

wherein the second temperature sensor provides feedback to a second TEC attached to the second thermally conductive baseplate, such that the temperatures of the first and second baseplates are controlled independently by the first and second TECs respectively.

* * * * *